(12) United States Patent
Zhang et al.

(10) Patent No.: US 11,462,461 B2
(45) Date of Patent: Oct. 4, 2022

(54) SYSTEM IN PACKAGE FOR LOWER Z HEIGHT AND REWORKABLE COMPONENT ASSEMBLY

(71) Applicant: Apple Inc., Cupertino, CA (US)

(72) Inventors: Leilei Zhang, Sunnyvale, CA (US); Lan H. Hoang, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/892,126

(22) Filed: Jun. 3, 2020

(65) Prior Publication Data

US 2021/0384113 A1    Dec. 9, 2021

(51) Int. Cl.
*H01L 23/498* (2006.01)
*H01L 21/56* (2006.01)
*H01L 23/31* (2006.01)

(52) U.S. Cl.
CPC ...... *H01L 23/49816* (2013.01); *H01L 21/565* (2013.01); *H01L 23/3157* (2013.01)

(58) Field of Classification Search
None
See application file for complete search history.

(56) References Cited

U.S. PATENT DOCUMENTS

| | | | |
|---|---|---|---|
| 8,039,304 B2 | 10/2011 | Pagaila | |
| 8,981,543 B2 | 3/2015 | Kwon et al. | |
| 9,583,472 B2 | 2/2017 | Chung et al. | |
| 2014/0185264 A1* | 7/2014 | Chen | H01L 23/3128 361/814 |
| 2015/0287700 A1* | 10/2015 | Yu | H01L 24/17 257/777 |
| 2016/0260695 A1* | 9/2016 | Chung | H01L 25/18 |
| 2017/0062383 A1* | 3/2017 | Yee | H01L 23/49838 |
| 2017/0069575 A1 | 3/2017 | Haba et al. | |
| 2017/0243826 A1 | 8/2017 | Lin et al. | |
| 2017/0250171 A1* | 8/2017 | Yu | H01L 24/19 |
| 2018/0358298 A1* | 12/2018 | Zhai | H01L 23/16 |
| 2019/0215964 A1 | 7/2019 | Long | |
| 2020/0001787 A1* | 1/2020 | Lu | G01J 3/513 |
| 2020/0273799 A1* | 8/2020 | Sung | H01L 25/0657 |

FOREIGN PATENT DOCUMENTS

| | | |
|---|---|---|
| CN | 107622957 A | 1/2018 |
| WO | 2006118720 A2 | 9/2006 |

\* cited by examiner

*Primary Examiner* — Khaja Ahmad
(74) *Attorney, Agent, or Firm* — Aikin & Gallant, LLP

(57) ABSTRACT

Electronic package structures and assembly methods are described. In an embodiment, an electronic package includes a die mounted face up on a bottom side of a package substrate, and a plurality of components on a top side of the package substrate. The plurality of components may be unmolded, and available for rework. Additional structures are included within the package substrate to provide mechanical rigidity and robustness to the package for warpage control.

15 Claims, 4 Drawing Sheets

SYSTEM IN PACKAGE FOR LOWER Z HEIGHT AND REWORKABLE COMPONENT ASSEMBLY

BACKGROUND

Field

Embodiments described herein relate to microelectronic packaging, and more particularly to reinforcement structures to facilitate rework processes.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, various multiple-die or component packaging solutions such as system in package (SiP) have become more popular to meet the demand for higher die/component density devices.

SiP structures typically include two or more dissimilar dies or components in a single package as a functional system or sub-system. For example, logic and memory may be combined into a single package, along with other components such as passive devices, MEMS devices, sensors, etc. The dies and components within an SiP can be stacked vertically or arranged horizontally on a routing substrate and encapsulated in a molding compound material to provide mechanical and chemical protection for the package. Thermosetting resins such as epoxy molding compound (EMC) are commonly used for molding compound materials due to their mechanical strength, moldability, and thermal and chemical stability.

SUMMARY

Electronic package structures including reinforcement structures to facilitate the rework of exposed components and assembly methods are described. In an embodiment, an electronic package includes a die mounted face up on a bottom side of a package substrate, and a plurality of components on a top side of the package substrate. The plurality of components may be unmolded, and available for rework. Additional structures may be included within the package to provide mechanical rigidity and robustness to the package for warpage control while maintaining reduced z-height of the package, including a top side molding layer between the components and the package substrate, a frame board mounted on the bottom side of the package substrate, and an unbalanced package substrate.

DETAILED DESCRIPTION

Figure 1:
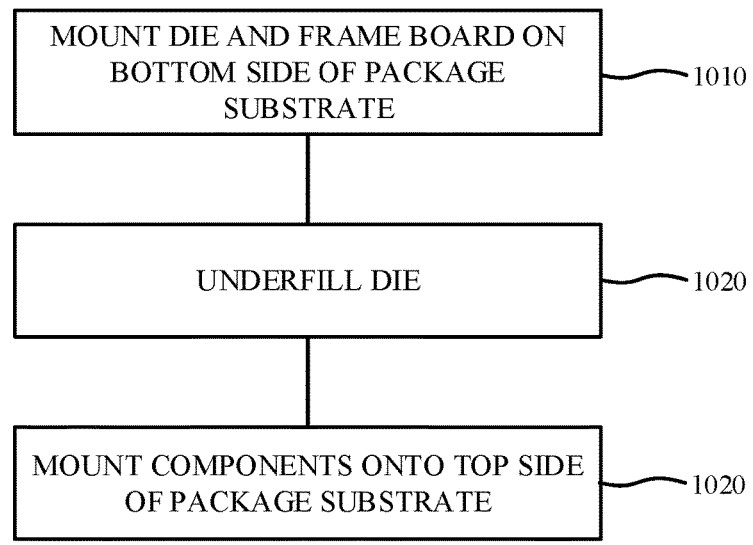
FIG. 1 is a flow chart illustrating a method of forming an electronic package without a molding layer in accordance with an embodiment.

Embodiments describe electronic packages, and methods of assembly thereof including reinforcement structures to facilitate rework processes of exposed components.

In one aspect, electronic package structure and assembly sequences are described in which components are unmolded, or more specifically not encapsulated or embedded within a molding compound material, in order to facilitate rework. For example, the components may not be encapsulated or embedded in a thermosetting material so that the components are not permanently attached. Manufacturing yield may be improved in accordance with embodiments by allowing package components to be replaced during new product introduction debug processes. Traditional system in package (SiP) structures and assembly sequences encapsulate package dies and components within various package-level molding layers. Most commonly, components are overmolded with a molding compound material that both encapsulates the components and spans over the components, hence being overmolded. A consequence of molding is that the components are permanently encapsulated or embedded within the molding compound material, cannot be removed, and are unavailable for rework. In addition to providing mechanical and chemical protection to the individual dies and components, the molding layers can also provide mechanical rigidity and robustness to the package in order to meet warpage control requirements, particularly for thin packages. In accordance with embodiments, various electronic package structures and assembly sequences are described in which alternative reinforcement structures are integrated in order to allow the components to remain unmolded, and available for rework. In some embodiments, the components can be considered bare components, for example, only connected to the package with corresponding solder bumps, not encapsulated or embedded within a molding compound material, or underfilled. In some embodiments, a reworkable underfill material can optionally be applied underneath the components. Reworkable underfill materials may be, but are not limited to, a non-thermosetting material (e.g. thermoplastic) or non-reflowable underfill material that allow for non-permanent attachment of the components (e.g. may be removed by desoldering). Additionally, z-height of the electronic package structure may be further reduced by not overmolding the components, and assembly cycle time can be reduced.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning" and "on" as used herein may refer to a relative position of one layer with respect to other layers. One layer "above", "over", "spanning" or "on" another layer or bonded "to" or in "contact" with another layer may be directly in contact with the other layer or may have one or more intervening layers. One layer "between" layers may be directly in contact with the layers or may have one or more intervening layers.

Figure 2:
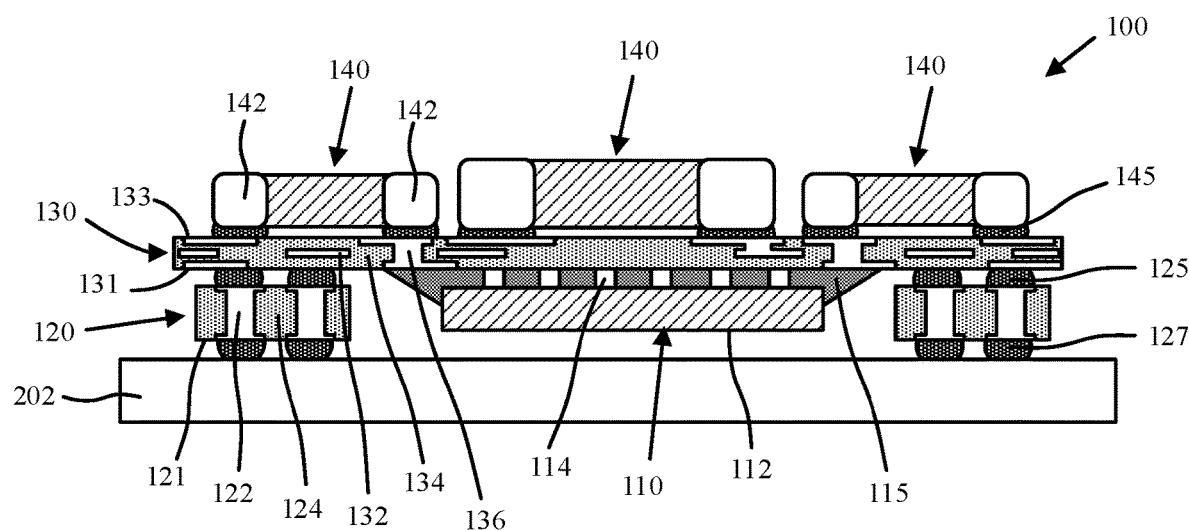
FIG. 2 is a schematic cross-sectional side view illustration of an electronic package without a molding layer in accordance with an embodiment.

Referring now to FIGS. 1-2, FIG. 1 is a flow chart illustrating a method of forming an electronic package 100 without a molding layer in accordance with an embodiment; FIG. 2 is a schematic cross-sectional side view illustration of an electronic package 100 without a molding layer in accordance with an embodiment. In interest of clarity and conciseness, the process flow of FIG. 1 is discussed concurrently with the structure illustrated in FIG. 2. The assembly process may begin with the package substrate 130. Such a substrate first approach enables a known good package substrate 130 before committing silicon and components for assembly, which can reduce cost and improve overall manufacture yield. Furthermore, this allows the placement of devices (e.g. dies, components) with different heights on both sides of the package substrate.

The package substrate 130 may be formed of a variety of materials, including traditional substrates such as FR-2 (a phenolic paper impregnated with resin), FR-4 (a woven fiberglass impregnate with resin), ABF (Ajinomoto Build-up Film), metal or metal core substrates, silicon core substrates, coreless substrates, ceramics, polymers, etc. The package substrate 130 may include multiple dielectric layers 134 and conductive layers, such as conductive traces 132 and vias 136 formed of suitable materials, such as copper, etc. to provide electrical connection between the bottom side 131 and the top side 133 of the package substrate 130.

In an embodiment, the package substrate 130 may be a fan out redistribution layer (RDL) formed by a layer-by-layer process, and may be formed using thin film technology. The RDL may be a thin film coreless substrate. Conductive traces 132 and vias 136 may be created by first forming a seed layer, followed by forming a metal (e.g., copper) pattern. Alternatively, conductive traces 132 and vias 136 may be formed by deposition (e.g., sputtering) and etching. The material of conductive traces 132 and vias 136 can include, but is not limited to, a metallic material such as copper, titanium, nickel, gold, and combinations or alloys thereof. The metal pattern is then embedded in a dielectric layer 134, which is optionally patterned. The dielectric layer 134 may be any suitable material such as an oxide, or polymer (e.g., polyimide). In accordance with embodiments, a thin film RDL package substrate 130 may have a thickness that is less than conventional organic or laminate substrates. For example, a conventional six metal layer organic or laminate substrate may have a thickness of 200 µm-500 µm. Thickness of an RDL package substrate 130 may be determined by the number of conductive traces 132 and dielectric layers 134 as well as the manner for formation. In accordance with embodiments, conductive traces 132 may have a thickness 10 µm or less, such as approximately 3-10 µm, and dielectric layers have a thickness of 5 µm or less, such as 2-5 µm. The RDLs in accordance with embodiments may additionally allow for narrower line spacing width (fine pitch) and thinner lines compared to conventional organic or laminate substrates. In an embodiment, the package substrate 130 has total a thickness of less than 70 µm, or more specifically approximately 50 µm or less, such as approximately 20 µm. In an exemplary implementation, a bi-layer for a conductive trace 132 and corresponding dielectric layer 134 can be approximately 5 µm for an RDL package substrate 130. Presuming a variation of up to an additional 30 µm for layer thickness variation, or additional passivation layers, an RDL package substrate 130 may be less than 50 µm for a 4 metal layer design, or less than 70 µm for an 8 metal layer design. In an embodiment, the package substrate 130 is a thin film RDL with a total thickness of less than 70 µm and 8 or less metal layers.

In an exemplary assembly sequence, a die 110 and frame board 120 can be mounted on the bottom side 131 of the package substrate 130 at operation 1010, followed by underfilling the die 110 with an underfill material 115 (e.g. epoxy, etc.) at operation 1020. In the illustrated embodiment, die 110 includes plurality of bumps 114 bonded to the bottom side 131 of the package substrate 130. In an embodiment, the bumps 114 are metal (e.g. copper) pillars, which can be metal-metal bonded to the package substrate 130, or bonded with solder bumps. In an embodiment, the die 110 can be pre-packaged, and thus bonded to the package substrate 130 as a package. A single die can be mounted, or a plurality of dies 110 can be mounted on the bottom side 131 of the package substrate 130. Additionally, one or more components can also be mounted. Thus, embodiments are not limited to the exemplary single die 110 configurations illustrated. In an embodiment, die 110 is a system on chip (SOC) for a power management unit (PMU) SiP.

The frame board 120 in accordance with embodiments includes a body 124 formed of suitable materials to provide structural stability, including those of the package substrate 130. Vias 122 (e.g. copper) may extend through a thickness of the frame board to provide subsequent electrical connection between a module substrate (e.g. printed circuit board) 202 and the package substrate 130. In an embodiment, solder bumps 125 are used to bond the frame board 120 to the package substrate 130. Package bumps 127 (e.g. solder) may be provided on the bottom side of the frame board 120 for subsequent mounting to a module substrate 202 upon completion of the fabrication sequence of the electronic package 100. Frame board 120 may be in the form of strips, or may include one or more openings within which the die(s) 110 are mounted. Thus the frame board 120 may laterally surround the die 110.

In an embodiment, a plurality of components 140 are then mounted on the top side 133 of the package substrate 130 at operation 1020. Components 140 can be a variety of active or passive devices (e.g. capacitors, sensors, inductors), MEMS devices, sensors, etc. In the illustrated embodiment components can include terminals 142 bonded to the package substrate 130, for example using solder bumps 145.

In an embodiment, an electronic package 100 includes a package substrate 130, a die 110 mounted face up (e.g. side including bumps 114) on a bottom side 131 of the package substrate 130, an underfill material 115 located between the die 110 and the bottom side 131 of the package substrate 130, a frame board 120 mounted on the bottom side 131 of the package substrate laterally adjacent to the die 110, and a plurality of components 140 mounted on a top side 133 of the package substrate 130. In accordance with embodiments, the plurality of components 140 and the die 110 are not encapsulated in a molding compound material. Such a configuration can use the frame board 120 at the package bump 127 locations (e.g. ball grid array, BGA) to create enough standoff distance between the die 110 back side 112 (e.g. not including bumps 114) and a module substrate 202 (once the package 100 is mounted onto the module substrate 202) to avoid possible solder ball opens. In an embodiment, a bottom side 121 of the frame board 120 is below a back side 112 of the die 110. Furthermore, the frame board 120 provides structural rigidity to mitigate package warpage and allow the components 140 to remain unmolded and available for rework.

Figure 3:
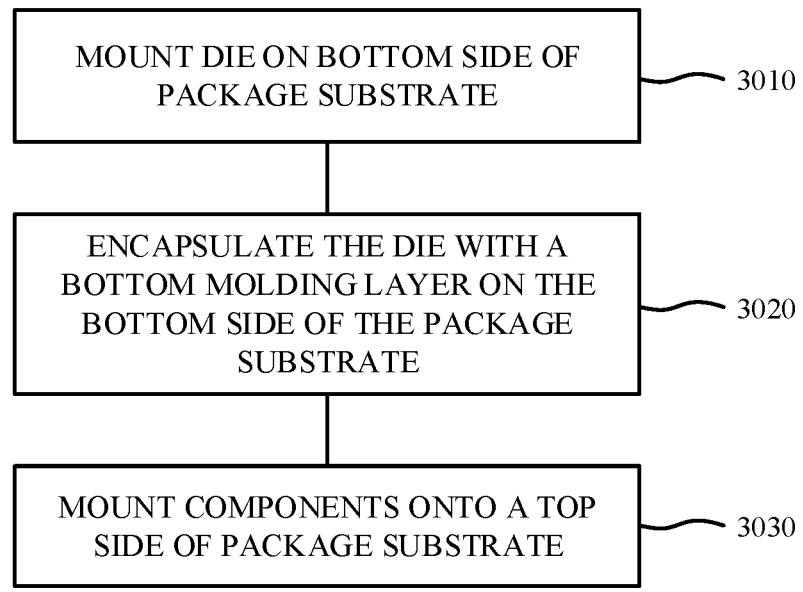
FIG. 3 is a flow chart illustrating a method of forming an electronic package with a bottom molding layer in accordance with an embodiment.
Figure 4:
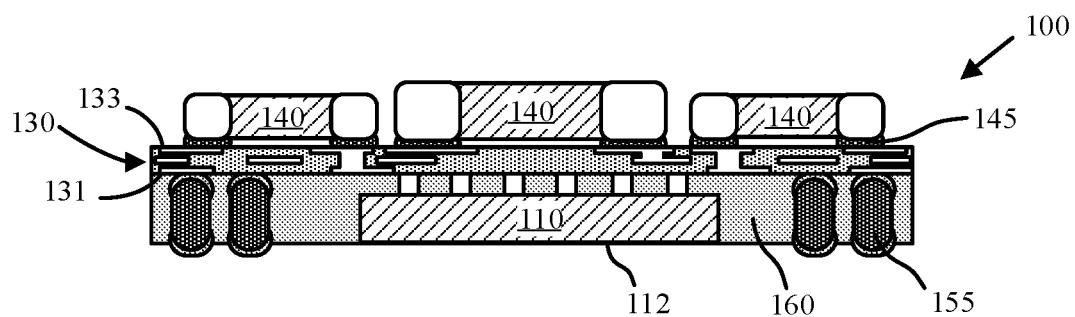
FIG. 4 is a schematic cross-sectional side view illustration of an electronic package with a bottom molding layer in accordance with an embodiment.

Referring now to FIGS. 3-4, FIG. 3 is a flow chart illustrating a method of forming an electronic package 100 with a bottom molding layer 160 in accordance with an embodiment; FIG. 4 is a schematic cross-sectional side view illustration of an electronic package 100 with a bottom molding layer 160 in accordance with an embodiment. In interest of clarity and conciseness, the process flow of FIG. 3 is discussed concurrently with the structure illustrated in FIG. 4.

In an exemplary assembly sequence, a die 110 can be mounted on the bottom side 131 of the package substrate 130 at operation 3010 similarly as described with regard to operation 1010. At operation 3020 the die is then encapsulated with a bottom molding layer 160 on the bottom side 131 of the package substrate 130. In the embodiment illustrated in FIG. 4 a plurality of through mold connections 155 extend from the package substrate 130 and through the bottom molding layer 160. The through mold connections 155 may be formed prior to, or after molding. For example, the through mold connections 155 may be copper plated vias or solder bumps formed prior to molding. Additional connection ends may optionally be applied after molding, and optionally polishing to expose or thin the back side 112 of die 110. Alternatively, through mold connections 155 can be formed after molding. In such an embodiment, a plurality of openings are formed in the bottom molding layer 160 and then filled with a conductive material such as solder material to form the through mold connections 155. In an alternative configuration the through mold connections 155 may be part of a frame board 120 (e.g. vias 122 and solder bumps 125) as described and illustrated with regard to FIGS. 6-7.

In an embodiment, a plurality of components 140 are then mounted on the top side 133 of the package substrate 130 at operation 3030, similarly as described with regard to operation 1020. The package 100 may then be mounted on a module substrate 202 using through mold connections 155. Such a configuration may contribute to overall z-height reduction of the electronic package, and system.

In accordance with embodiments, the inclusion of the bottom molding layer 160 without a corresponding top side molding layer can contribute to unequal package stress and warpage. Accordingly, the package substrate 130 may be an unbalanced substrate to balance out the molding compound material effect on package warpage. In an embodiment, the package substrate 130 is a laminate of multiple layers in which a top half of the laminate (e.g. adjacent top side 133) has a higher coefficient of thermal expansion (CTE) than does a bottom half (e.g. adjacent bottom side 131) of the laminate. In this manner, the higher CTE of the top half of the package substrate 130 can counterbalance a high CTE of the bottom molding layer 160, and reduce overall package warpage.

FIGS. 5A-5D are schematic cross-sectional side view illustrations of unbalanced package substrates 130 in accordance with embodiments. Generally, each package substrate may include a laminate stack of conductive layers, dielectric layers, and passivation layers. As shown, a package substrate can include a bottom passivation layer 501 and top passivation layer 502. The top and bottom passivation layers may be formed of solder mask, insulating oxide, polymers (e.g. polyimide), etc. Dielectric layers may be formed of a variety of electrically insulating materials, including polymers, including ABF (Ajinomoto Build-up Film) resins such as epoxy, cyanate esters, etc., as well as glass fiber composites. Exemplary glass fiber composites include s-glass polypropylene (PP) in which a PP matrix is filled with s-glass fibers (commonly an alumino-silicate glass without CaO but with high MgO content with high tensile strength), or e-glass PP in which a PP matrix is filled with e-glass fibers (commonly an alumino-borosilicate glass with less than 1% w/w alkali oxides).

Figure 5A:
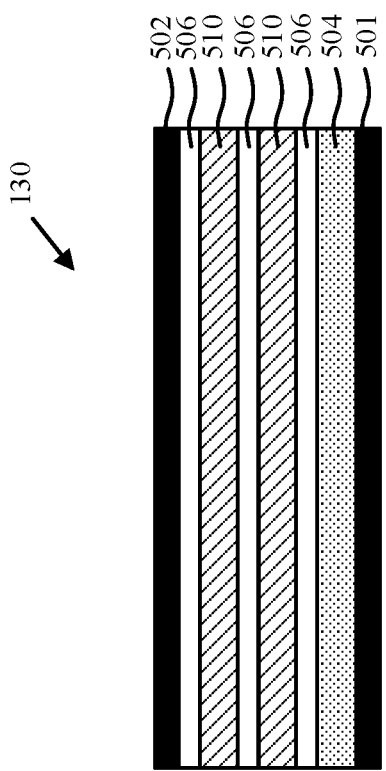
FIGS. 5A-5D are schematic cross-sectional side view illustrations of unbalanced package substrates in accordance with embodiments.
Figure 5B:
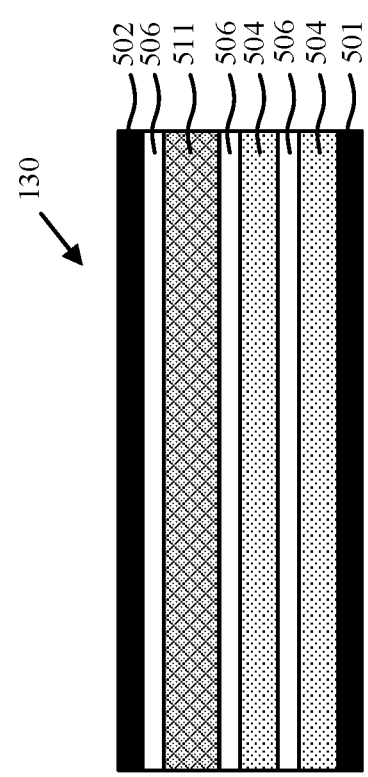
Figure 5C:
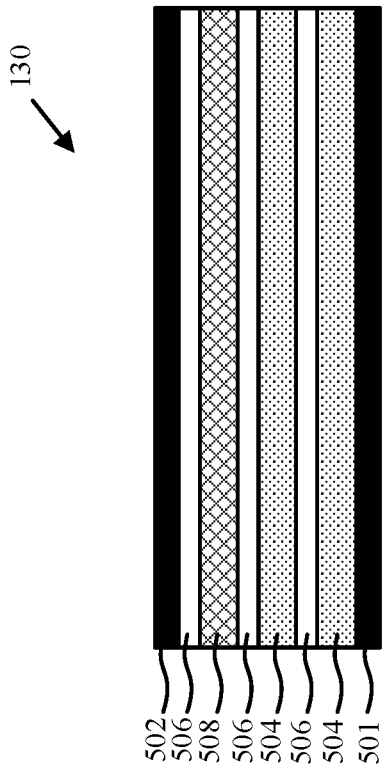
Figure 5D:
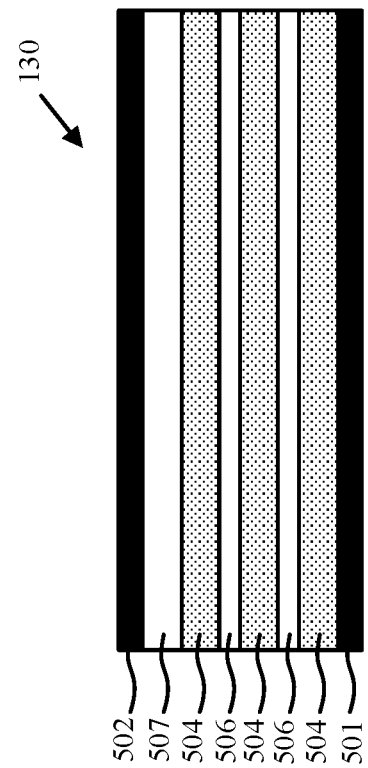

In an embodiment, the package substrate 130 includes a first dielectric layer with a higher coefficient of thermal expansion (CTE) within the top half of the package substrate 130 than for other dielectric layers within the bottom half of the package substrate. Such an embodiment is illustrated in FIGS. 5A-5B and 5D. FIG. 5A is an illustration of a package substrate 130 including bottom passivation layer 501, top passivation layer 502, multiple metal layers 506, and multiple layer of a low CTE dielectric layer 504 and a high CTE dielectric layer in the top half of the package substrate. By way of example only, the low CTE dielectric layers 504 may be formed of an s-glass PP. In the embodiment illustrated in FIG. 5A, the high CTE dielectric layer 508 is an e-glass PP. In the embodiment illustrated in FIG. 5B, the high CTE dielectric layer 510 is an ABF film, which has a higher CTE than the low CTE dielectric layer 504. In the embodiment illustrated in FIG. 5D, the high CTE dielectric layer 511 is a thicker layer of e-glass PP or ABF film, that is, a layer that is thicker than the low CTE dielectric layers 504.

In an embodiment, the package substrate 130 includes a first metal layer 507 with a higher CTE within the top half of the package substrate than for other metal layers 506 within the bottom half of the package substrate. For example, the first metal layer 507 may be a thicker copper layer relative to the (copper) metal layers 506, and have a higher CTE and modulus due to the increased thickness.

Figure 6:
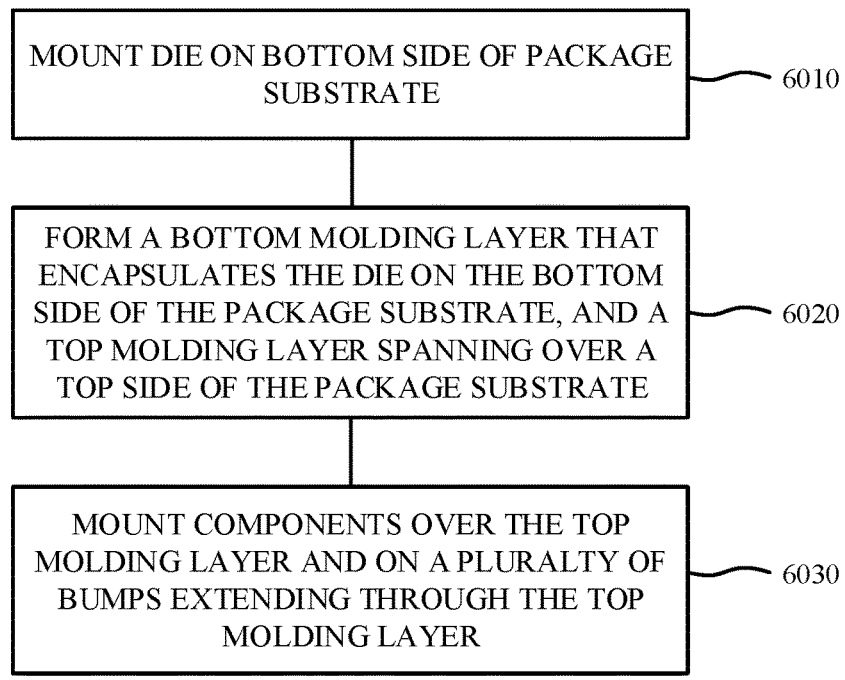
FIG. 6 is a flow chart illustrating a method of forming an electronic package with top side and bottom molding layers in accordance with an embodiment.
Figure 7:
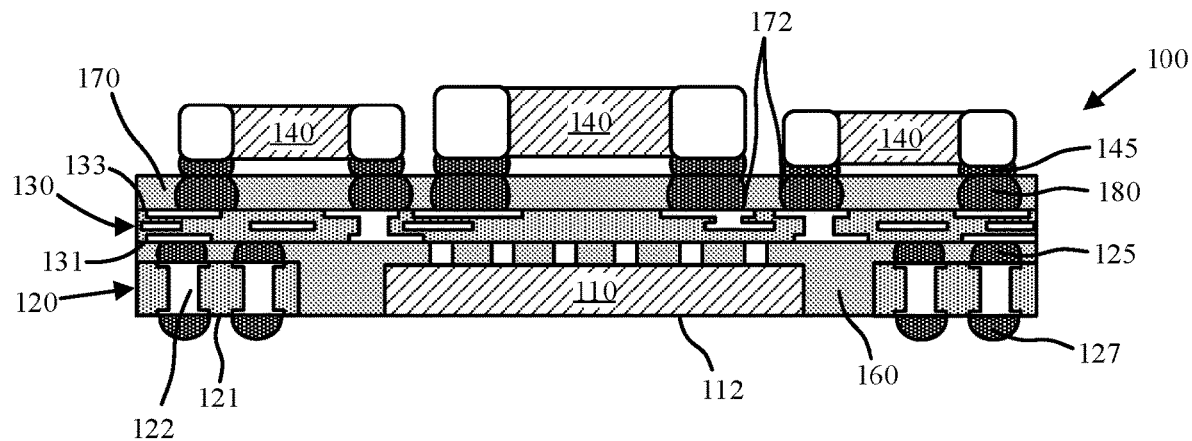
FIG. 7 is a schematic cross-sectional side view illustration of an electronic package with top side and bottom molding layers in accordance with an embodiment.

Referring now to FIGS. 6-7, FIG. 6 is a flow chart illustrating a method of forming an electronic package with top side and bottom molding layers in accordance with an embodiment; FIG. 7 is a schematic cross-sectional side view illustration of an electronic package with top side and bottom molding layers in accordance with an embodiment. In interest of clarity and conciseness, the process flow of FIG. 6 is discussed concurrently with the structure illustrated in FIG. 7.

In an exemplary assembly sequence, a die 110 can be mounted on the bottom side 131 of the package substrate 130 at operation 6010 similarly as described with regard to operations 1010 and 3010. At operation 6020 the die can then be encapsulated with a bottom molding layer 160 on the bottom side 131 of the package substrate 130 similarly as described with regard to operation 3020. Through mold connections can optionally be provided on the bottom side 131 of the package substrate 130 prior to encapsulation. In the embodiment illustrated in FIG. 7, the through mold connections are in the form of a frame board 120 mounted onto the bottom side 131 of the package substrate 130 prior to molding, where the frame board vias 122 and solder bumps 125 function as the through mold vias. The frame board 120 can optionally be encapsulated in the bottom molding layer 160 along with the die 110. A polishing operation can optionally be performed to thin any of the die 110 and frame board 120 and bottom molding layer 160, and expose the back side 112 of the die 110 and bottom side 121 of the frame board 120. Package bumps 127 (e.g. solder) may be provided on the bottom side of the frame board 120 for subsequent mounting to a module substrate 202.

Alternative through mold connections can be provided through the bottom molding layer 160. For example, similar to the embodiment illustrated in FIG. 4 a plurality of through mold connections 155 extend from the package substrate 130 and through the bottom molding layer 160. The through mold connections 155 may be formed prior to, or after molding. For example, the through mold connections 155 may be copper plated vias or solder bumps formed prior to molding. Additional connection ends may optionally be applied after molding, and optionally polishing to expose or thin the back side 112 of die 110. Alternatively, through mold connections 155 can be formed after molding. In such an embodiment, a plurality of openings are formed in the bottom molding layer 160 and then filled with a conductive material such as solder material to form the through mold connections 155.

Still referring to FIGS. 6-7, in accordance with embodiments a top molding layer 170 can also be formed at operation 6020, with the top molding layer 170 spanning over the top side 133 of the package substrate 130. For example, the top molding layer 170 and bottom molding layer 160 can be formed simultaneously with a dual sided molding technique. The top molding layer 170 and bottom molding layer 160 may optionally be formed of the same composition (molding compound material), though different molding compound materials can be chosen.

The top molding layer 170 may be provided for structural support, to counterbalance warpage from the bottom molding layer 160. In an embodiment, the top molding layer 170 does not encapsulate an electronic device, such as a die or component. In the illustrated embodiment, a plurality of bumps 180 extend through a thickness of the top molding layer 170 to make contact with the top side 133 of the package substrate 130. The bumps 180 may be formed before or after the top molding layer 170. In an embodiment, a plurality of openings 172 are formed in the top molding layer (after molding) to expose the top side 133 of the package substrate 130, and the plurality of bumps 180 are then formed within the plurality of openings 172, for example, by application of a solder material to the plurality of openings. In an embodiment, the plurality of bumps 180 is formed on the top side 133 of the package substrate 130, and then the top molding layer 170 is formed encapsulating the plurality of bumps 180.

Components 140 may then be mounted over the top molding layer 170 and on the plurality of bumps 180 extending through the top molding layer 170 at operation 6030. In such a configuration, the components 140 remain exposed and available for rework. The electronic package 100 may then be mounted onto a module substrate 202, for example with package (solder) bumps 127.

In an embodiment, an electronic package 100 includes a package substrate 130, a die 110 mounted face up on a bottom side 131 of the package substrate 130, a bottom molding layer 160 encapsulating the die 110 on the bottom side 131 of the package substrate 130, a top molding layer 170 spanning a top side 133 of the package substrate 130, a plurality of bumps 180 extending through the top molding layer 170 on the top side 133 of the package substrate 130, and a plurality of components 140 mounted on the plurality of bumps 180. In accordance with embodiments, the plurality of components 140 may not be encapsulate in a molding compound material so that they are available for rework, for example by desoldering from the plurality of bumps 180.

Any combination of structural features described herein can be provided to compensate for the unmolded components 140. For example, top molding layer 170 may provide such structural support. In an embodiment, a frame board 120 is mounted on the bottom side 131 of the package substrate 130. The frame board 120 may optionally be embedded in the bottom molding layer 160. In an embodiment, the package substrate 130 is an unbalanced substrate, where differences in CTE are designed to provide structural support. In an embodiment, the package substrate 130 is a laminate in which a top half of the laminate has a higher CTE than does a bottom half of the laminate.

In utilizing the various aspects of the embodiments, it would become apparent to one skilled in the art that combinations or variations of the above embodiments are possible for forming an electronic package with exposed components available for rework. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic package assembly comprising:
   a module substrate; and
   an electronic package mounted on the module substrate with a plurality of solder bumps, the electronic package including:
      a package substrate including a top side and a bottom side;
      a die mounted face up on the bottom side of the package substrate;
      a frame board mounted on the bottom side of the package substrate, wherein the plurality of solder bumps is on a bottom side of the frame board and bonded to the module substrate;
      a bottom molding layer encapsulating the die and the frame board on the bottom side of the package substrate;
      a top molding layer spanning the top side of the package substrate;
      a plurality of bumps extending through the top molding layer on the top side of the package substrate, wherein the plurality of bumps is substantially located inside a thickness of the top molding layer; and
      a plurality of components mounted on the plurality of bumps;
   wherein the module substrate is wider than the electronic package.

2. The electronic package assembly of claim 1, wherein the plurality of components are not encapsulated in a molding compound material.

3. The electronic package assembly of claim 2, wherein the plurality of components are removable by desoldering from the plurality of bumps.

4. The electronic package assembly of claim 2, wherein the module substrate is a printed circuit board.

5. The electronic package assembly of claim 2, wherein the package substrate is a laminate in which a top half of the laminate has a higher coefficient of thermal expansion (CTE) than does a bottom half of the laminate.

6. The electronic package assembly of claim 2, wherein the top molding layer does not encapsulate an electronic device.

7. The electronic package assembly of claim 2, wherein the package substrate is a thin film redistribution layer with a total thickness of less than 70 μm and 8 or less metal layers.

8. The electronic package assembly of claim 2, wherein the plurality of bumps are formed of a solder material.

9. The electronic package assembly of claim 8, wherein the top molding layer does not encapsulate an electronic device.

10. The electronic package assembly of claim 9, wherein the bottom molding layer and the top molding layer are formed of a same material.

11. The electronic package assembly of claim 9, wherein the plurality of components are bonded to the plurality of bumps with a plurality of component solder bumps.

12. The electronic package assembly of claim 11, wherein the plurality of component solder bumps are in direct contact with the plurality of bumps.

13. The electronic package assembly of claim 2, wherein:
the top molding layer does not encapsulate an electronic device; and
the bottom molding layer and the top molding layer are formed of a same material.

14. The electronic package assembly of claim 2, wherein:
the top molding layer does not encapsulate an electronic device; and
the plurality of components are bonded to the plurality of bumps with a plurality of component solder bumps.

15. The electronic package assembly of claim 14, wherein the plurality of component solder bumps are in direct contact with the plurality of bumps.

* * * * *